United States Patent
Sakurai

[19]

[11] Patent Number: 6,091,592
[45] Date of Patent: Jul. 18, 2000

[54] PROTECTIVE CIRCUIT AND ELECTRIC CIRCUIT USING THE PROTECTIVE CIRCUIT

[75] Inventor: Atsushi Sakurai, Chiba, Japan

[73] Assignee: Seiko Instruments Inc., Japan

[21] Appl. No.: 09/160,395

[22] Filed: Sep. 25, 1998

[30] Foreign Application Priority Data

Sep. 26, 1997 [JP] Japan .................................. 9-262476

[51] Int. Cl.$^7$ ...................................................... H02H 3/22
[52] U.S. Cl. ................. 361/56; 361/58; 361/111; 361/91.2
[58] Field of Search ................... 361/56, 58, 91, 361/111, 117–118, 91.2

[56] References Cited

U.S. PATENT DOCUMENTS

| | | |
|---|---|---|
| 4,456,939 | 6/1984 | Ozaki et al. ............................... 361/56 |
| 4,527,213 | 7/1985 | Ariizumi ................................... 361/56 |
| 5,430,602 | 7/1995 | Chin et al. ................................ 361/212 |
| 5,760,630 | 6/1998 | Okamoto ................................. 327/310 |

*Primary Examiner*—Michael J. Sherry
*Attorney, Agent, or Firm*—Adams & Wilks

[57] ABSTRACT

A protective circuit for protecting a circuit from a destructive voltage or current, comprising a MIS transistor, and at least one resistor connected in series with the MIS transistor for limiting current flow through the MIS transistor, wherein a resistance value R of the at least one resistor connected in series with the MIS transistor satisfies the relation R>(A–B)/C, wherein A is a surge voltage against which protection is provided, B is a hold voltage at a breakdown of the MIS transistor, and C is a maximum allowable current of the MIS transistor. The at least one resistor is connected in series with a source of the MIS transistor, a drain of the MIS transistor, or both the source and the drain of the MIS transistor, and the resistance value of the resistance is preferably smallest value that satisfies the relation R>(A –B)/C.

16 Claims, 5 Drawing Sheets

PROTECTIVE CIRCUIT AND ELECTRIC CIRCUIT USING THE PROTECTIVE CIRCUIT

BACKGROUND OF THE INVENTION

1. Field of the Invention

The present invention relates to a protective circuit for protecting an internal circuit against an abnormal voltage or abnormal current such as static electricity or a surge, and also relates to an electric circuit using the protective circuit.

2. Description of the Related Art

A conventional protective circuit protects an internal circuit in such a manner that the protective circuit is connected between a ground terminal and external input/output terminals extending from the internal circuit, and is turned on only in the case where static electricity or a surge is applied, so that the static electricity or surge flows from the input/output terminals to the ground terminal without flowing through the internal circuit.

FIG. 2 is a block diagram showing an electric circuit including a conventional protective circuit.

In FIG. 2, a ground terminal 205, an external input terminal 206 for connecting a power source 208, and an external output terminal 207 for connecting an external load 209 are extended from an internal circuit 203 to which a specific function is given according to an object. A protective circuit 201 is connected between the ground terminal 205 and the external input terminal 206, and a protective circuit 202 is connected between the ground terminal 205 and the external output terminal 207, so that an electric circuit 204 is formed.

When a voltage higher than the maximum operation voltage of the internal circuit is applied to the external input terminal 206, the protective circuit 201 is immediately turned on to permit a current to flow therethrough, so that the voltage at the external input terminal 206 is lowered. In this way, the protective circuit protects the internal circuit 203 against static electricity or a surge applied to the external input terminal 206. The protective circuit 202 also protects the internal circuit 203 against static electricity or a surge applied to the external output terminal 207 in the same way as the protective circuit 201.

FIG. 3 is a circuit diagram showing a conventional protective circuit.

In FIG. 3, a protective circuit 301 is formed in such a manner that a drain of an enhancement N-channel MOS transistor 302 (hereinafter referred to as NMOS Tr 302), which is one type of MIS transistor, is connected to an input terminal 306, and a gate, source, and substrate are connected to a ground terminal 205. Since gate and source of the NMOS Tr 302 are of the same potential, a channel between the drain and source is normally in an insulated state.

The protecting operation of the protective circuit shown in FIG. 3 will be described with reference to FIG. 4.

FIG. 4 is a diagram showing an I-V curve of the protective circuit 301.

In FIG. 4, when a voltage applied between the input terminal 306 and the ground terminal 205 of the protective circuit in FIG. 3 is increased, a surface breakdown is caused in the NMOS Tr 302, which has been in an insulated state, at the time when the voltage exceeds the withstand voltage Vt between the drain and source, and further a snapback is induced through a hold voltage Vh. As a result, the channel between the drain and source is made conductive. By this, a large current flows from the input terminal 306 to the ground terminal 205 through the NMOS Tr 302 as the protective circuit 301, so that the voltage at the input terminal 306 is lowered. Thereafter, when the voltage at the input terminal 306 falls below Vh, the NMOS Tr 302 returns again to an insulated state and the protective circuit 301 ends the protecting operation.

When the withstand voltage Vt of the NMOS Tr 302 is adjusted so that it is not less than the maximum operation voltage of the internal circuit 203 and not larger than the withstand voltage of the internal circuit 203, and the input terminal 306 is replaced by the external input terminal 206 or the external output terminal 207, the protective circuit 301 in FIG. 3 can be used as the protective circuit 201 or the protective circuit 202 in FIG. 2, and can protect the internal circuit 203 against static electricity or a surge input to the external input terminal 206 or the external output terminal 207.

However, in the conventional protective circuit 301 constructed as in FIG. 3, since a current at the protecting operation is restricted by only a small conduction resistance of the NMOS Tr 302, a large current is apt to flow through the protective circuit 301. In addition, since it is difficult to increase the conduction resistance, and further, the unevenness in manufacture of semiconductor is large, there is a problem in that it is difficult to obtain a target value and to adjust the resistance.

In FIG. 4, when a voltage applied to the input terminal 306 is further increased from the state in which a large current flows by the snapback, if a current increases so that the current exceeds an allowable current Im of the NMOS Tr 302, the NMOS Tr 302 causes heat destruction so that it enters a short circuit or insulating state and is destroyed. In the case of short circuit destruction, since the input terminal 306 and the ground terminal 205 are short-circuited, it becomes impossible to apply an input signal to the input terminal 306, and in the case where the internal circuit is connected to the input terminal 306, the internal circuit becomes impossible to operate normally. On the other hand, in the case of insulation destruction, since the protective circuit 301 does not operate thereafter even if a surge is applied to the input terminal 306, in the case where the internal circuit is connected to the input terminal 306, there is a case where the surge is applied to the internal circuit so that the internal circuit is destroyed. This, the destruction of the protective circuit has a considerably bad effect on the internal circuit and the electric circuit consisting of the protective circuit and the internal circuit.

In the conventional protective circuit, since the resistance during the protecting operation is small, there is a problem that a current over an allowable current of a MIS transistor is apt to flow so that the destruction of the protective circuit as described above is apt to occur. Moreover, there is a problem in that malfunction or destruction of the internal circuit caused by the destruction of the protective circuit is apt to occur. That is, there is a problem in that the protective limit against a surge is low so that sufficient protective characteristics can not be obtained.

In addition, in the conventional protective circuit, there is a problem in that since it is difficult to increase and adjust the resistance during the protecting operation, it is impossible to freely adjust the protective limit.

With the above-mentioned problems, there is a problem in that it is impossible to provide an electric circuit having improved safety.

SUMMARY OF THE INVENTION

An object of the present invention is therefore to solve the above problems of the prior art and to provide a protective circuit in which a high protective limit against surge is achieved and the protective limit can be freely adjusted.

In order to solve the above problems, according to the protective circuit of the present invention, such a circuit construction is adopted and means for adjusting current is provided in the protective circuit, such that the resistance of the protective circuit at the time of electrical conduction during the time of a protecting operation is suitably increased, so that a large current can not easily flow.

According to the foregoing structure of the protective circuit of the present invention, when a surge is applied so that the protective circuit operates and a portion between an arbitrary terminal to be protected and a ground terminal enters a conductive state, the means for adjusting current operates to restrict the value of current flowing through the protective circuit. Thus, since only a current smaller than that in the prior art flows through the protective circuit, the protective circuit can not be easily destroyed so that it is possible to protect the internal circuit against a larger surge. That is, it is possible to increase the protective limit of the protective circuit.

In addition, since the value of current flowing through the protective circuit can be controlled to an arbitrary value by the means for adjusting current, it is possible to adjust the protective limit of the protective circuit.

DETAILED DESCRIPTION OF THE PREFERRED EMBODIMENTS

Preferred embodiments of the present invention will now be described with reference to the drawings.

Figure 1:
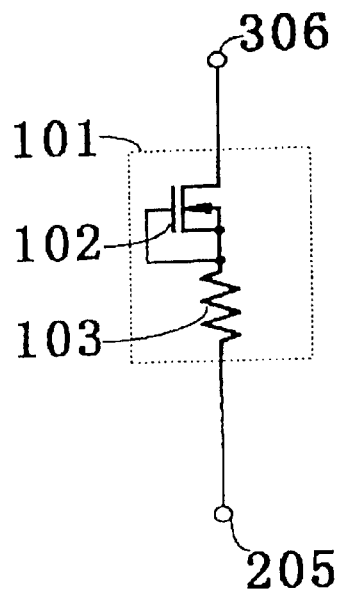
FIG. 1 is a circuit diagram showing a protective circuit of a first embodiment of the present invention.

FIG. 1 is a circuit diagram showing a protective circuit of a first embodiment of the present invention.

In FIG. 1, a protective circuit 101 is formed in such a way that a drain of an enhancement N-channel MOS transistor 102 (hereinafter referred to as NMOS Tr 102), which is one kind of MIS transistor, is connected to an input terminal 306, a gate, source, and substrate are connected to one end of a resistor 103, and the other end of the resistor 103 is connected to a ground terminal 205. The conventional NMOS Tr 102 is similar to the NMOS Tr 302 of FIG. 3, and since the gate and source are at the same potential, a channel between the drain and source is normally in an insulated state. However, if a voltage exceeding the withstand voltage between the drain and source of the NMOS Tr 102 is applied to the input terminal 306, the NMOS Tr 102 causes a surface breakdown, and then induces a snapback so that the channel between the drain and source is made conductive. As a result, a current flows from the input terminal 306 to the ground terminal 205 through the NMOS Tr 102 and the resistor 103, so that the voltage at the input terminal 306 is lowered. Thereafter, when the voltage at the input terminal 306 falls below the hold voltage of the NMOS Tr 102, the channel between the drain and source returns again to an insulated state. Here, since the resistance value R103 of the resistor 103 is connected in series to the conduction resistance value R102 of the NMOS Tr 102, the value of current flowing through the protective circuit 101 is suitably restricted by R102+R103.

Figure 3:
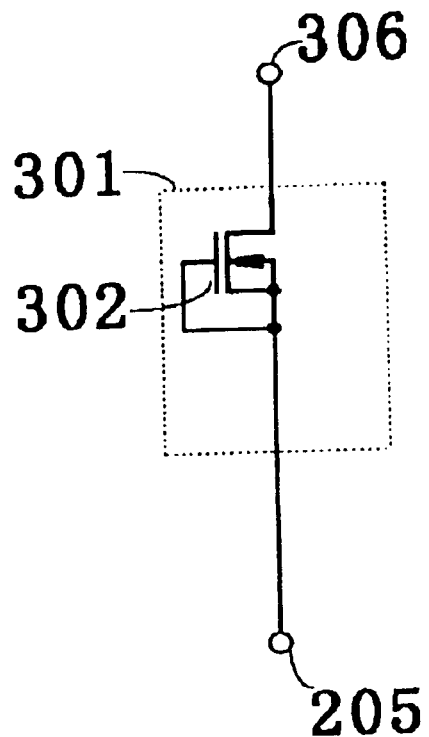
FIG. 3 is a circuit diagram showing a conventional protective circuit.
Figure 4:
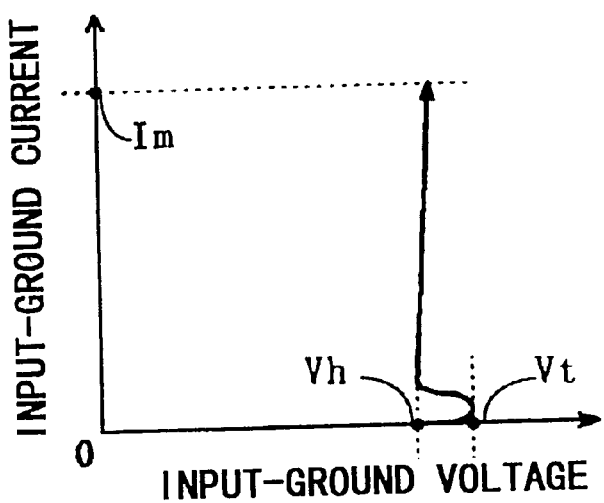
FIG. 4 is a view showing an I-V curve of the conventional protective circuit shown in FIG. 3.

Next, in order to explain the effect of the resistor 103, a comparison will be made between the cases where a surge by which a current exceeding Im shown in FIG. 4 flows through the protective circuit 301 shown in FIG. 3, is applied to the conventional protective circuit 301 and the protective circuit 101 of the present invention. In the case where the surge is applied to the conventional protective circuit 301, the protective circuit 301 is destroyed, as described above. On the other hand, in the case where the surge is applied to the protective circuit 101 of the present invention, by setting the resistor 103 to a suitable value, it is possible to restrict the current flowing during the protecting operation to Im or less. As described above, since the NMOS Tr 102 is similar to the NMOS Tr 302, an allowable current of the NMOS Tr 102 is the same as Im. Thus, the protective circuit 101 is not destroyed and the protecting operation can be continued.

Figure 5:
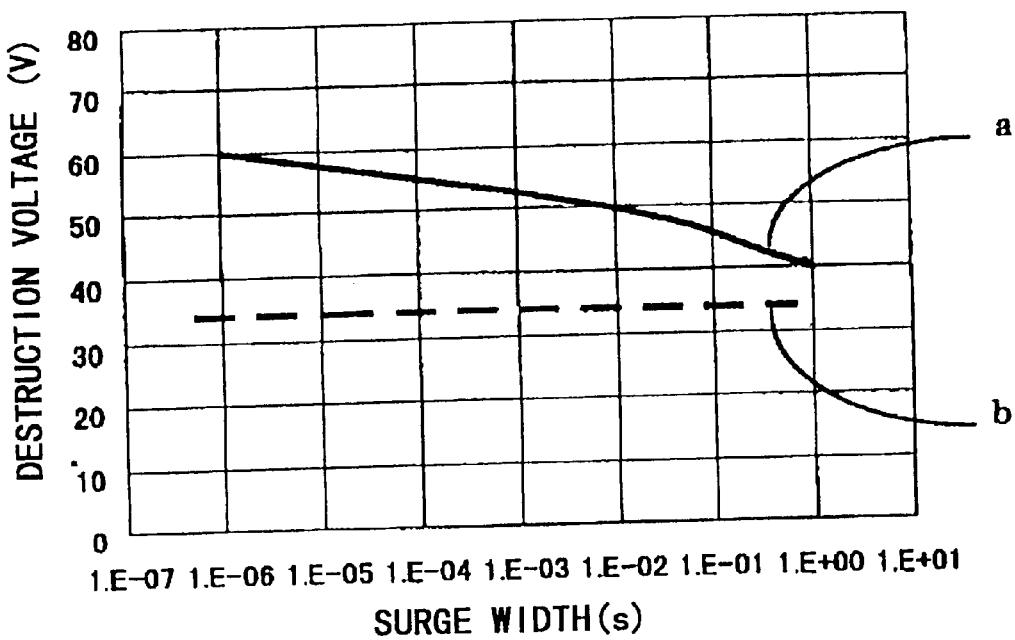
FIG. 5 is a view showing surge resistance characteristics showing usefulness of a protective circuit of the present invention.

FIG. 5 is a view of surge resistance characteristics showing the usefulness of a protective circuit of the present invention.

FIG. 5 shows the result of examination of the relation between the voltage at which the protective circuit is destroyed and the width of a surge, when the surge is applied between the ground terminal 205 and the input terminal 306 of the protective circuit. From FIG. 5, when the resistor having the resistance R103 is formed of a diffusion resistance of about 230 Ω, a curve "a" of the surge resistance characteristics of the protective circuit 101 of the present invention indicates values of protective limits obviously high as compared with a curve "b" of the surge resistance characteristics of the conventional protective circuit 301. Thus, it is understood that the present invention is useful.

As described above, the protective circuit of the present invention can increase the protective limit against a surge as compared with the conventional protective circuit.

In the conventional protective circuit, since the resistance at the protecting operation is merely formed of a small conduction resistance of the NMOS Tr 302, it is actually impossible to increase the conduction resistance. In addition, when it is considered that the conduction resistance becomes uneven by a semiconductor manufacturing process, it is difficult to fix the resistance to a target value and to adjust the resistance after manufacturing. On the other hand, in the protective circuit 101 of the present invention, not only can the resistance value R103 be freely set to a value in view of the size of a surge applied to an internal circuit to be protected but it is also easy to fix the value to a target value or to adjust the value after manufacturing.

From the above, in the protective circuit of the present invention, as compared with the conventional protective circuit, it is easy to adjust the protective limit against a surge.

The resistance value R103 can be roughly calculated from a supposed surge voltage, a hold voltage of the MIS transistor, and an allowable current.

If the following inequality

R103>(supposed surge voltage−hold voltage)/allowable current (1)

is satisfied, even if the supposed surge is applied, the protective circuit 101 is not destroyed. Thus, it is preferable that R103 satisfies the above inequality.

However, even if the equation (1) is satisfied, if R103 is too large, the voltage at the input terminal 306 is increased until the power of the surge has completely dissipated to the ground terminal through the protective circuit 101. If the voltage at the input terminal 306 exceeds the withstand voltage of the internal circuit to be protected which is connected to the input terminal, the internal circuit is destroyed. Thus, it is further preferable that R103 satisfies the inequality (1) and is set to a value as small as possible.

Figure 6:
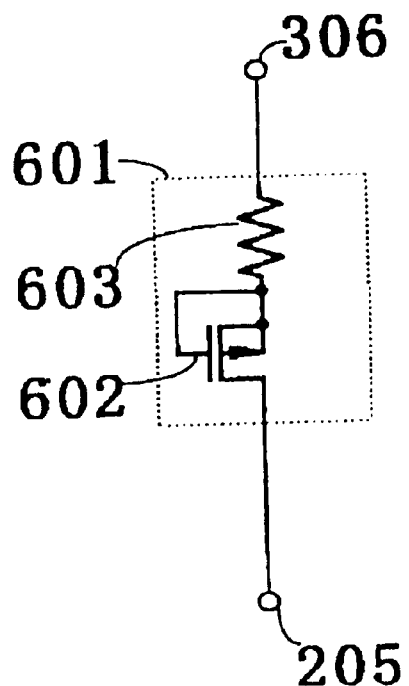
FIG. 6 is a circuit diagram showing a protective circuit of a second embodiment of the present invention.

FIG. 6 is a circuit diagram showing a protective circuit of a second embodiment of the present invention.

In FIG. 6, a protective circuit 601 is formed in such a manner that a drain of an enhancement P-channel MOS transistor 602 (hereinafter referred to as PMOS Tr 602), which is a kind of MIS transistor, is connected to the ground terminal 205, a gate, source, and substrate are connected to one end of a resistor 603, and the other end of the resistor 603 is connected to the input terminal 306.

The protective circuit 601 can also carry out the same protecting operation as the protective circuit 101, and the same effect can be obtained.

Figure 7:
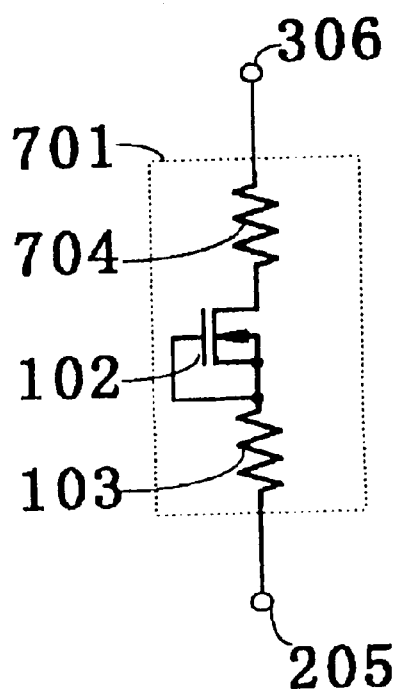
FIG. 7 is a circuit diagram showing a protective circuit of a third embodiment of the present invention.

FIG. 7 is a circuit diagram showing a protective circuit of a third embodiment of the present invention.

In FIG. 7, a resistor 704 is inserted between an input terminal 306 of the protective circuit and the drain of the NMOS Tr 102 to form a protective circuit 701.

The protective circuit 701 can also carry out the same protecting operation as the protective circuit 101, and the same effect can be obtained.

Like this, it is sufficient if the protective circuit of the present invention has a structure so that current flowing to the MIS transistor is adjusted to a maximum allowable current or less of the MIS transistor at the breakdown, and as the means for adjusting current, any circuit structure may be adopted other than the resistor shown in the above-described embodiments. It is sufficient that the gate voltage of the MIS transistor is set to a voltage so that the channel between the drain and source of the MIS transistor is turned OFF, and any circuit structure may be adopted other than the connection to the source terminal as in the embodiment.

Figure 2:
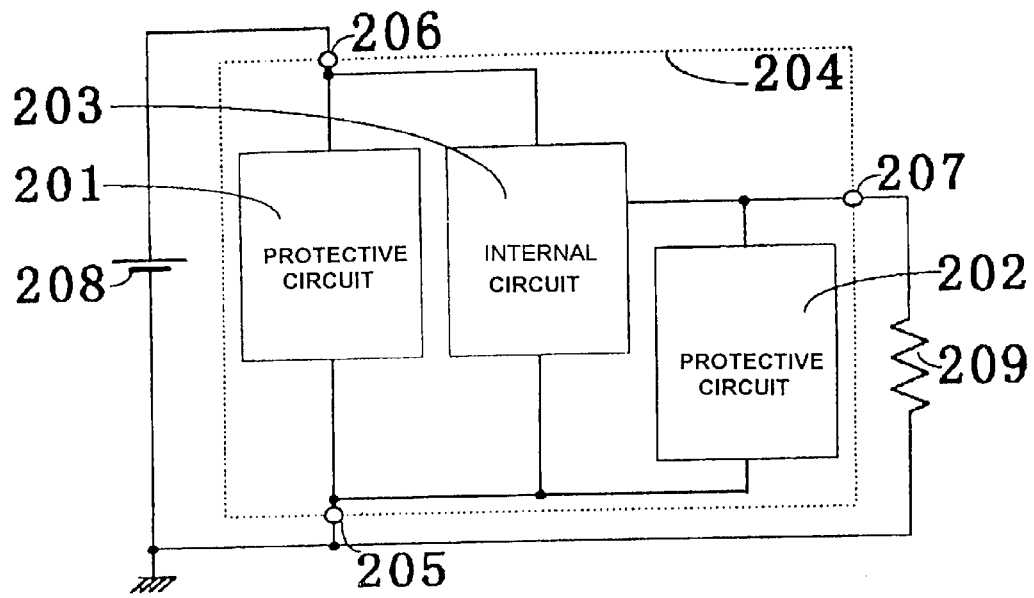
FIG. 2 is a block diagram showing an electric circuit including a conventional protective circuit.

Any of the protective circuits of the present invention can be used as the protective circuit 201 or the protective circuit 202 in FIG. 2 when the withstand voltage of the MIS transistor is adjusted above the maximum operation voltage of the internal circuit 203 and below the withstand voltage of the internal circuit 203, and the input terminal 306 is replaced by the external input terminal 206 or the external output terminal 207. Thus, the protective circuit can protect the internal circuit 203 against static electricity or a surge input to the external input terminal 206 and the external output terminal 207. In the same way, the protective circuit may be widely used for protection at input and output terminals of the other electric circuits.

Figure 8:
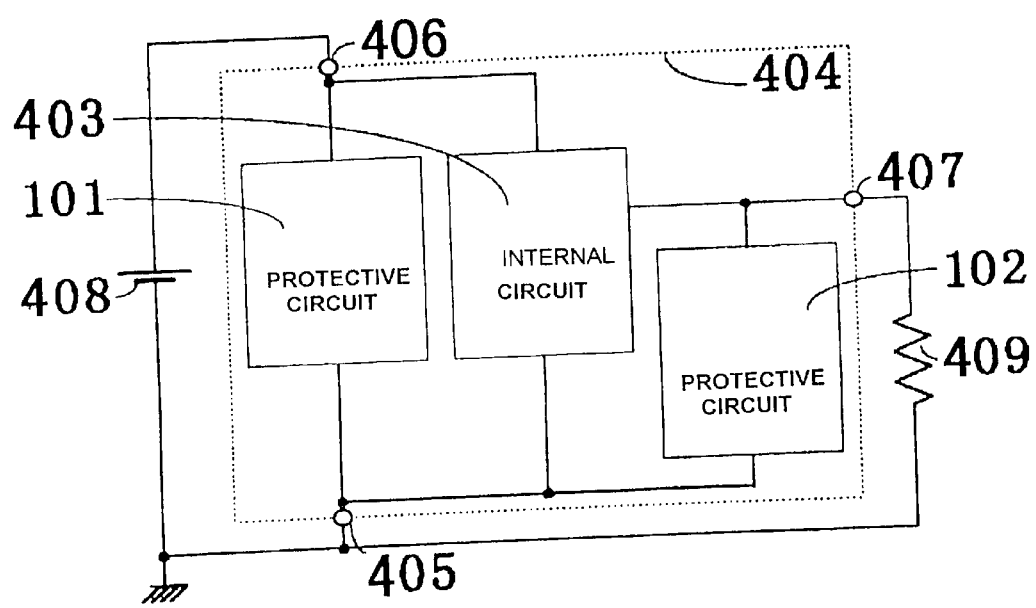
FIG. 8 is a block diagram showing an electric circuit including a protective circuit of the present invention.

FIG. 8 is a block diagram of an electric circuit in which the protective circuit of the present invention is adopted.

In FIG. 8, an internal circuit 403 is a circuit to which a specific function is given according to its object. A ground terminal 405, an external input terminal 406 for connecting a power source 408, and an external output terminal 407 for connecting an external load 409 are extended from this circuit. The protective circuit 101 of the present invention is connected between the ground terminal 405 and the external input terminal 406, and the protective circuit 102 of the present invention is connected also between the ground terminal 405 and the external output terminal 407. The electric circuit 404 is constituted by the above respective circuits.

According to the protective circuit of the present invention, as compared with the prior art, since the resistance at the protecting operation is large, a current larger than an allowable current of a MIS transistor can not easily flow. Thus, the present invention has the effect that destruction of the protective circuit does not easily occur. Moreover, the present invention has the effect that a bad operation or destruction of an internal circuit due to the destruction of the protective circuit do not easily occur. That is, the present invention has the effect that the protective limit against a surge is high and sufficient protective characteristics can be obtained.

In addition, in the protective circuit of the present invention, since it is easy to increase and adjust the resistance at the protecting operation, the present invention has the effect that the protective limit can be freely adjusted.

With the foregoing effects, the present invention has the effect that an electric circuit having improved safety can be provided.

What is claimed is:

1. A protective circuit for protecting a circuit against an abnormal voltage or an abnormal current, comprising:
   at least one MIS transistor; and
   at least one resistor connected in series with the MIS transistor for limiting current flow through the MIS transistors
   wherein a gate voltage of the MIS transistor is set at a voltage where a channel between a drain and source of the MIS transistor is turned OFF; and
   wherein a resistance value R of the at least one resistor connected in series with the MIS transistor satisfies the relation R>(A−B)/C, wherein A is a surge voltage against which protection is provided, B is a hold voltage at a breakdown of the MIS transistor, and C is a maximum allowable current of the MIS transistor.

2. A protective circuit according to claim 1; wherein the at least one resistor is connected in series with a source of the MIS transistor, a drain of the MIS transistor, or both the source and the drain of the MIS transistor.

3. In an electric circuit having an internal circuit for performing a function, and a a protective circuit connected to the internal circuit for protecting the internal circuit from damage due to an abnormal voltage or an abnormal current; wherein the protective circuit comprises a protective circuit according to any one of claims 1 and 2.

4. A protective circuit for protecting a circuit from a destructive voltage or current, comprising: a MIS transistor; and at least one resistor connected in series with the MIS transistor for limiting current flow through the MIS transistor; wherein a resistance value R of the at least one resistor connected in series with the MIS transistor satisfies; the relation R>(A−B)/C, wherein A is a surge voltage against which protection is provided, B is a hold voltage at a breakdown of the MIS transistor, and C is a maximum allowable current of the MIS transistor.

5. A protective circuit according to claim 4; wherein the at least one resistor is connected in series with a source of the MIS transistor, a drain of the MIS transistor, or both the source and the drain of the MIS transistor.

6. A protective circuit according to claim 4; wherein the at least one resistor comprises one resistor connected in series with a source of the MIS transistor.

7. A protective circuit according to claim 4; wherein the at least one resistor comprises one resistor connected in series with a drain of the MIS transistor.

8. A protective circuit according to claim 4; wherein the at least one resistor comprises a first resistor connected in series with a source of the MIS transistor and a second resistor connected in series with a drain of the MIS transistor.

9. A protective circuit according to claim 4; wherein the resistance value R is the smallest value that satisfies the relation $R>(A-B)/C$.

10. A method of protecting a circuit from an abnormally high voltage or current, comprising the steps of:

connecting a MIS transistor between external connection terminals of the circuit;

selecting a resistor having a resistance value sufficient to prevent a current through a series connection of the resistor and the MIS transistor from exceeding a maximum allowable current of the MIS transistor so that an abnormally high voltage or current at the external connection terminals will be dissipated through the MIS transistor at a current limited to the maximum allowable current thereof; and connecting the resistor in series with the MIS transistor.

11. A method according to claim 10; wherein the resistance value R satisfies the relation $R>(A-B)/C$ wherein A is a surge voltage against which protection is provided, B is a hold voltage at a breakdown of the MIS transistor, and C is a maximum allowable current of the MIS transistor.

12. A method according to claim 10; wherein the resistor is connected in series with a source of the MIS transistor, a drain of the MIS transistor, or both the source and the drain of the MIS transistor.

13. A method according to claim 10; wherein the resistor is connected in series with a source of the MIS transistor.

14. A method according to claim 10; wherein the resistor is connected in series with a drain of the MIS transistor.

15. A method according to claim 10; wherein the resistor comprises a first resistance connected in series with a source of the MIS transistor and a second resistor connected in series with a drain of the MIS transistor.

16. A method according claim 10; wherein the resistance value R is set as the smallest value that satisfies the relation $R>(A-B)/C$, wherein A is a surge voltage against which protection is provided, B is a hold voltage at a breakdown of the MIS transistor, and C is a maximum allowable current of the MIS transistor.

* * * * *